United States Patent
Qiao

(10) Patent No.: US 8,243,962 B2
(45) Date of Patent: Aug. 14, 2012

(54) MEMS MICROPHONE AND METHOD FOR MANUFACTURING THE SAME

(75) Inventor: Dong-Hai Qiao, Shenzhen (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1420 days.

(21) Appl. No.: 11/782,441

(22) Filed: Jul. 24, 2007

(65) Prior Publication Data

US 2009/0016550 A1 Jan. 15, 2009

(30) Foreign Application Priority Data

Jul. 13, 2007 (CN) .......................... 2007 1 0076043

(51) Int. Cl.
*H04R 25/00* (2006.01)
(52) U.S. Cl. ........................................ 381/175; 381/355
(58) Field of Classification Search .................. None
See application file for complete search history.

(56) References Cited

U.S. PATENT DOCUMENTS

| 5,573,679 | A * | 11/1996 | Mitchell et al. ................ 216/2 |
| 6,741,709 | B2 * | 5/2004 | Kay et al. .................... 381/175 |
| 6,743,654 | B2 * | 6/2004 | Coffa et al. .................... 438/52 |
| 2006/0169049 | A1 * | 8/2006 | Matsubara ....................... 73/754 |
| 2006/0177085 | A1 * | 8/2006 | Izuchi et al. .................... 381/369 |
| 2007/0064968 | A1 * | 3/2007 | Weigold ......................... 381/369 |

OTHER PUBLICATIONS

Altti Torkkeli, Outi Rusanen, Jaakko Saarilahti, Heikki Seppä, Hannu Sipola, and Jarmo Hietanen, "Capacitive microphone with low-stress polysilicon membrane and high-stress polysilicon backplate", Sensors and Actuators, vol. 85, 2000, pp. 116-123.*

* cited by examiner

Primary Examiner — Yuwen Pan
Assistant Examiner — Taunya McCarty
(74) Attorney, Agent, or Firm — Altis Law Group, Inc.

(57) ABSTRACT

An MEMS microphone includes a casing (10) and a microphone chip (30) disposed in the casing. The casing defines a sound entrance (11) therein. The microphone chip includes a back plate (31), an isolation layer (32) and a diaphragm (33). The isolation layer separates the back plate from the diaphragm so as to form an air interstice (35) therebetween. The back plate and the diaphragm electrically connect with two electrodes (34a, 34b), respectively. The back plate defines a plurality of holes (36) therethrough. The holes communicate the air interstice with a sealed acoustic chamber (38) between the casing and the microphone chip. The diaphragm is adhered to an inner side of the casing at a position over the sound entrance.

9 Claims, 20 Drawing Sheets

MEMS MICROPHONE AND METHOD FOR MANUFACTURING THE SAME

BACKGROUND OF THE INVENTION

1. Field of the Invention

The present invention relates generally to microphones, and more particularly to an MEMS (micro electromechanical system) microphone and method for manufacturing the same.

2. Description of Related Art

Sound is one important means by which people communicate with each other, thus creating new methods for sound transference which allows greater communication between people is an important area of technological development. Electroacoustic transducers are key components in transferring sound. Microphone is a typical electroacoustic transducer. There are many different types of microphones, such as ECM (electric condenser microphone), or MEMS (micro electromechanical system) microphone.

An MEMS microphone includes a casing, a microphone chip arranged in the casing, and circuits (not shown) disposed in the casing and electrically connected with the microphone chip. The microphone chip includes an oscillating diaphragm, a silicon back plate, an isolation layer and a silicon substrate. The back plate defines a plurality of holes therethrough. An air interstice is formed between the oscillating diaphragm and the back plate. The back plate, the isolation layer and the oscillating diaphragm are placed on the silicon substrate in that order. The silicon substrate provides a rear acoustic chamber therein. The acoustic chamber communicates with the oscillating diaphragm via the holes of the back plate so that when the oscillating diaphragm is driven to vibrate by a sound source, an electrical signal is generated.

In the MEMS microphone, the acoustic chamber should preferably be designed to have a large size so as to increase the sensitivity of the MEMS microphone. However, since the acoustic chamber of the conventional MEMS microphone is formed by etching the silicon substrate, to form a large acoustic chamber in the conventional MEMS microphone will increase the size of the MEMS microphone, which violates the compact size and lightness requirements for the MEMS microphone. Furthermore, to etch the large acoustic chamber in the silicon substrate is time consuming and costly. Therefore, it is necessary to provide an inexpensive MEMS microphone having a large acoustic chamber with a size compatible with modern portable technologies.

SUMMARY OF THE INVENTION

The present invention relates, in one aspect, to an MEMS microphone. The MEMS microphone includes a casing and a microphone chip disposed in the casing. The casing defines a sound entrance therein. The microphone chip includes a back plate, an isolation layer and a diaphragm. The isolation layer separates the back plate from the diaphragm so as to form an air interstice therebetween. The back plate and the diaphragm electrically connect with two electrodes, respectively. The back plate defines a plurality of holes therethrough. The holes communicate with the air interstice. One of the diaphragm and the back plate faces to the sound entrance and hermetically connects with the casing so as to form a sealed acoustic chamber between the casing and the microphone chip.

The present invention relates, in another aspect, to a method for manufacturing the MEMS microphone. The method includes: providing first and second silicon substrates, forming the diaphragm on the first silicon substrate, forming the isolation layer on the second silicon substrate, selectively etching the isolation layer and forming an air interstice at an etched portion of the isolation layer, etching the holes in the second silicon substrate but without extending through the second silicon substrate, bonding the diaphragm and the remained isolation layer, removing the first silicon substrate from the diaphragm, selectively etching the diaphragm, thinning a side of the second silicon substrate until the holes are revealed, obtaining the microphone chip, packaging the microphone chip in the casing, and obtaining the MEMS microphone.

The present invention relates, in third aspect, to another method for manufacturing the MEMS microphone. The method includes: providing a silicon substrate, forming an isolation layer on a front side of the silicon substrate, forming a diaphragm on the isolation layer, selectively etching the diaphragm and the isolation layer, thinning a rear side of the silicon substrate, etching the holes in the silicon substrate, etching an air interstice in the isolation layer through the holes, obtaining the microphone chip, packaging the microphone chip in the casing, and obtaining the MEMS microphone.

Other advantages and novel features of the present invention will become more apparent from the following detailed description of first embodiments when taken in conjunction with the accompanying drawings, in which:

DETAILED DESCRIPTION OF THE INVENTION

Figure 1:
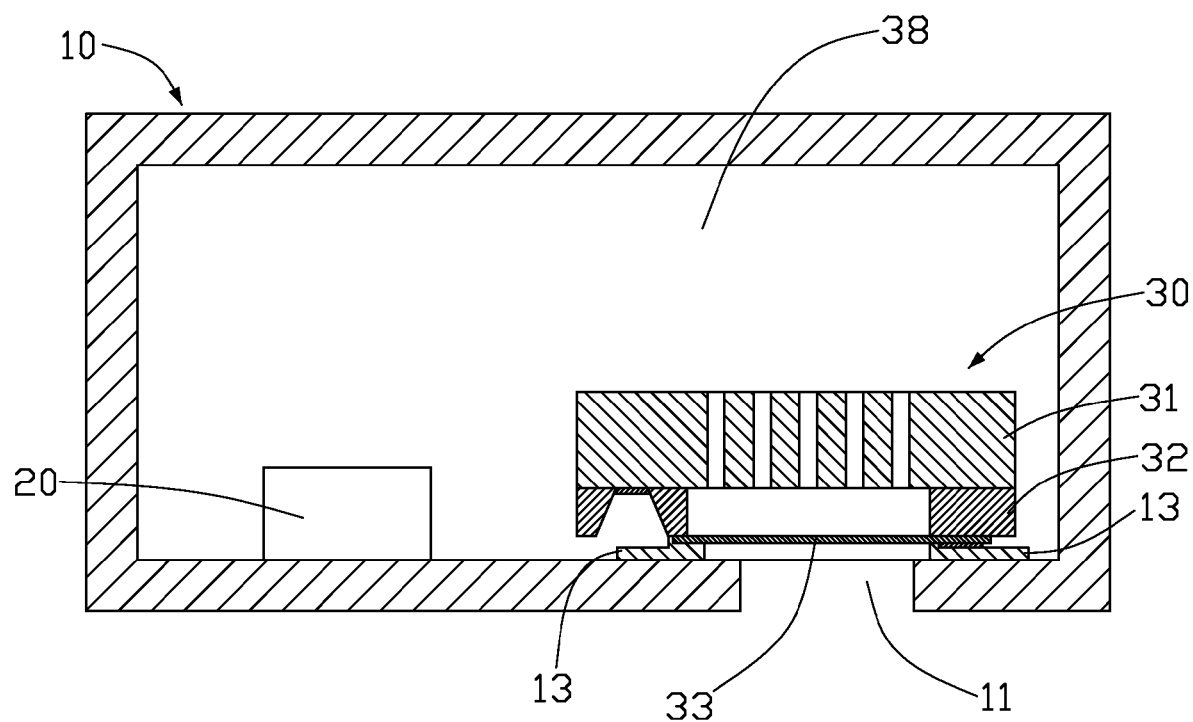
FIG. 1 is an explanation, cross sectional view of an MEMS microphone in accordance with a first embodiment of the present invention.

Reference will now be made to the drawing figures to describe the first embodiment in detail.

FIG. 1 is an isometric view of an MEMS (micro electromechanical system) microphone in accordance with a first embodiment of the present invention. The MEMS microphone includes a sealed casing 10, a microphone chip 30 arranged in the casing 10, and circuits 20 disposed in the sealed casing 10 and electrically connected with the microphone chip 30.

Figure 2:
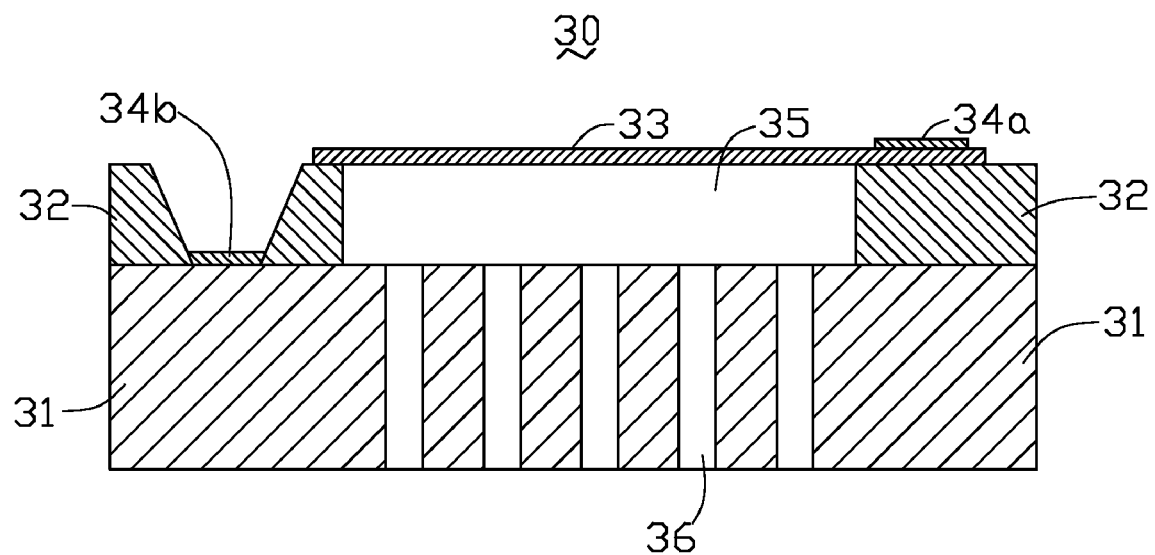
FIG. 2 is an explanation, cross sectional view of a microphone chip of the MEMS microphone of FIG. 1.

Referring to FIG. 2, the microphone chip 30 includes a back plate 31, an isolation layer 32, a flexible oscillating diaphragm 33 and first and second electrodes 34a, 34b.

The back plate 31 is made of doped P-type silicon, doped N-type silicon, or intrinsic silicon. Preferably, the back plate 31 is made of a $P^+$-doped polysilicon. The back plate 31 functions as a fixed electrode plate and a substrate of the microphone chip 30. The isolation layer 32, the diaphragm 33, and the first and second electrodes 34a, 34b are disposed on the back plate 31. A plurality of holes 36 are etched through the back plate 31. A side face (not labeled) of the back plate 31 opposite from the isolation layer 32 is flat in configuration.

The isolation layer 32 is sandwiched between the back plate 31 and the diaphragm 33. The isolation layer 32 is made of silicon oxide ($SiO_2$), or composite materials including some kinds of isolating materials such as silicon oxide and silicon nitride. A middle portion of the isolation layer 32 is etched thereby forming an air interstice 35 between the back plate 31 and the diaphragm 33. The air interstice 35 communicates with an inner space of the sealed casing 10 via the holes 36. A left portion of the isolation layer 32 is also etched so as to deposit the second electrode 34b on a top surface of the back plate 31. The second electrode 34b is electrically connected with the back plate 31.

The diaphragm 33 is made of polycrystalline silicon. Alternatively, the diaphragm 33 can be made of isolating materials such as some kind of organic materials, or silicon nitride. The diaphragm 33 can also be made of conductive materials such as doped P-type silicon, or doped N-type silicon. Preferably, the diaphragm 33 is made of an $N^+$-doped polysilicon. The first electrode 34a is deposited on and electrically connects with the diaphragm 33. The diaphragm 33 therefore functions as a deformable electrode plate of the microphone chip 30 and can deform under an external pressure, i.e., an acoustic wave. A variable capacity is therefore formed between the diaphragm 33 and the back plate 31. When a bias voltage is exerted on the capacity, a change capacity between the diaphragm 33 and the back plate 31 is transformed into a voltage change therebetween. The voltage change is transferred to the circuits 20 via the first and second electrodes 34a, 34b.

The first and second electrodes 34a, 34b are made of metallic materials such as aluminum, aluminum alloy, or gold. The first and second electrodes 34a, 34b respectively and electrically connect with the diaphragm 33 and the back plate 31. When the diaphragm 33 is made of isolating materials, the electrode 34a needs to cover a portion of the diaphragm 33 which is above the air interstice 35 so as to generate an electric field between the diaphragm 33 and the back plate 31. Similarly, the first electrode 34a need only cover a discretionary portion of the diaphragm 33 to generate the electric field when the diaphragm 33 is made of conductive materials.

Figure 3:
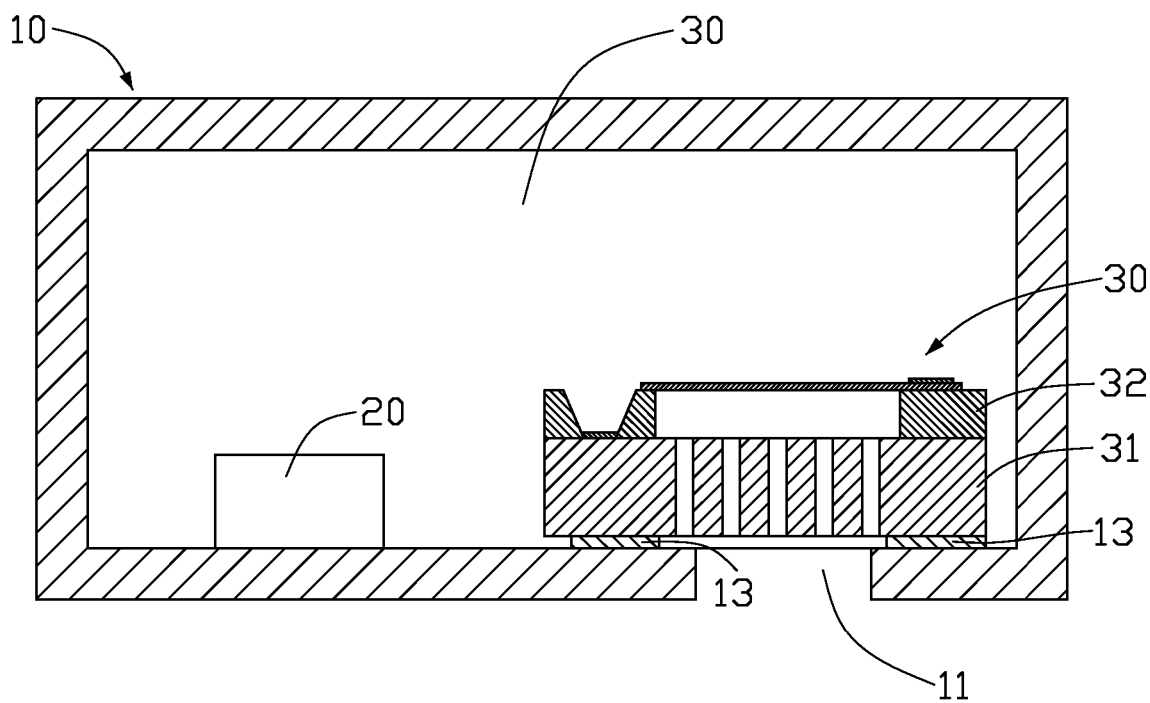
FIG. 3 is an explanation, cross sectional view of an MEMS microphone in accordance with a second embodiment of the present invention.

Particularly referring to FIG. 1, the sealed casing 10 defines a sound entrance 11 therein. The diaphragm 33 or the back plate 31 (shown in FIG. 3) of the microphone chip 30 is arranged facing towards the sound entrance 11. A layer of adhesive 13 can be spread between the diaphragm 33 of the microphone chip 30 and an inner surface of the sealed casing 10, or alternatively, between the back plate 31 of the microphone chip 30 and the inner surface of the sealed casing 10. A sealed chamber 38 is formed between the casing 10 and the microphone chip 30, functioning as a rear acoustic chamber 38 of the microphone chip 30 of the MEMS microphone.

Comparing with the conventional MEMS microphone, the rear acoustic chamber 38 of the present MEMS microphone is formed between the sealed casing 10 and the microphone chip 30, but not on the silicon substrate of the microphone chip. Therefore, the size of the rear acoustic chamber 38 of the present MEMS microphone is greater than that of the conventional MEMS microphone which has the same size as the present MEMS microphone. This improves the sensitivity of the present MEMS microphone. Thus, the present MEMS microphone is thinner than the conventional MEMS microphone of the same sensitivities. Therefore, the present MEMS microphone can be used in electronic products having compact size. Moreover, a piece of silicon plate can be used to manufacture more microphone chips 30 than conventional microphone chips, which decreases the cost of the present microphone chip 30.

Figure 4:
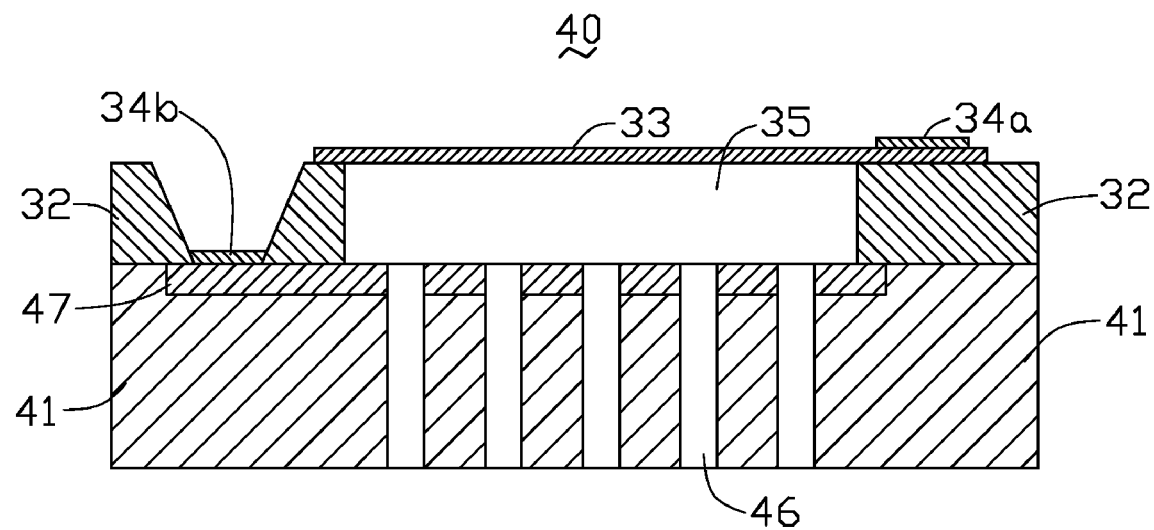
FIG. 4 is an explanation, cross sectional view of a microphone chip of an MEMS microphone in accordance with a second embodiment of the present invention.

Referring to FIG. 4, a second embodiment of a microphone chip 40 of the present MEMS microphone is shown. The microphone chip 40 of the second embodiment is substantially similar to the microphone chip 30 of the first embodiment. In the second embodiment, the back plate 41 includes an assistant conductive layer 47 immersed or diffused into a middle portion of a top section of the back plate 41. The assistant conductive layer 47 contacts with the second electrode 34b and decreases ohmic contact between the back plate 41 and the second electrode 34b. The assistant conductive layer 47 is a highly doped silicon layer with a high boron content or a thin metal layer. Therefore, the back plate 41 can be regarded as being made of two different kinds of materials. When the assistant conductive layer 47 is the highly doped silicon layer, the back plate 41 can also be regarded as being made of one material having two different diffusion concentrations.

Figure 5:
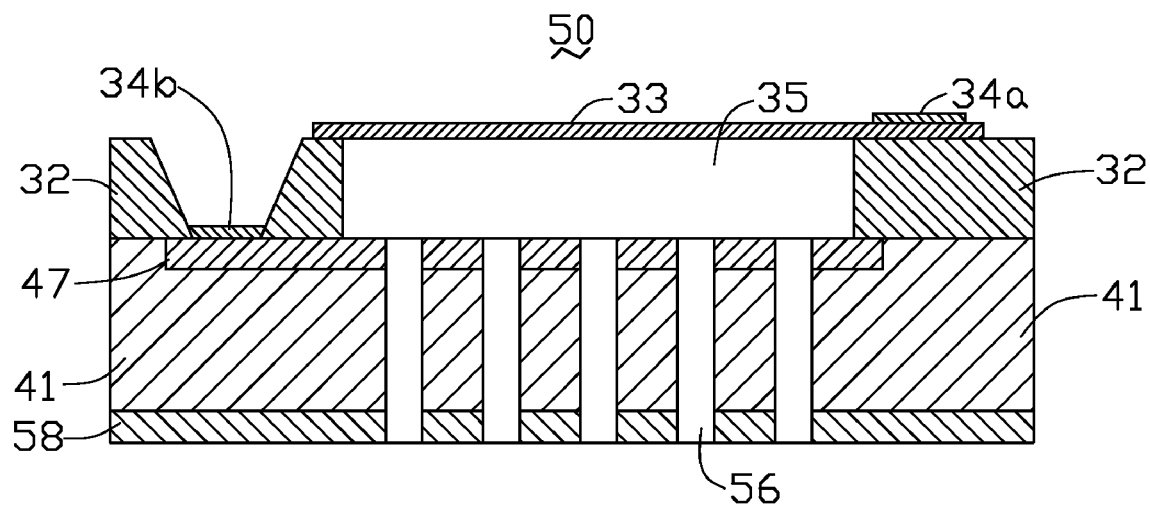
FIG. 5 is an explanation, cross sectional view of a microphone chip of an MEMS microphone in accordance with a third embodiment of the present invention.

Referring to FIG. 5, a third embodiment of a microphone chip 50 of the present MEMS microphone is shown. The microphone chip 50 of the third embodiment is further improved under the microphone chip 40 of the second embodiment. In the third embodiment, there is a passivation layer 58 spread on a bottom section of the back plate 41 and opposite to the isolation layer 32 so as to protect the back plate 41. The passivation layer 58 is a silicon oxide layer, or a silicon nitride layer, or a composite layer made of a composition of polycrystalline silicon and silicon oxide, or an organic layer, or a metallic layer such as an aluminum layer. The holes 56 extend through the back plate 41 (including the assistant conductive layer 47) and the passivation layer 58, communicating the air interstice 35 with the inner space of the sealed casing 10.

Figure 6:
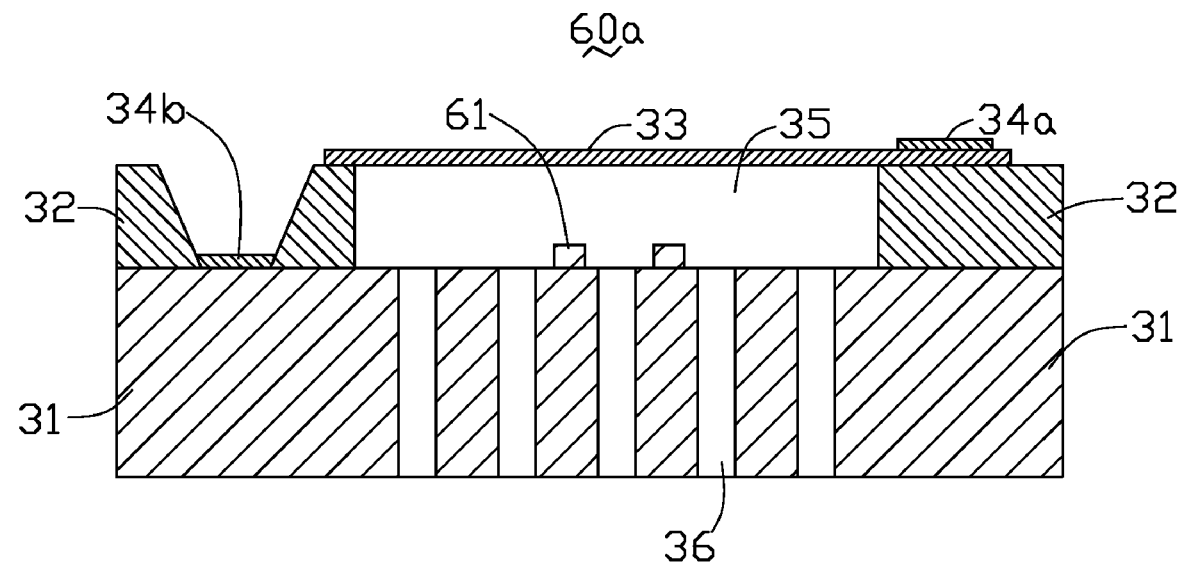
FIG. 6 is an explanation, cross sectional view of a microphone chip of an MEMS microphone in accordance with a fourth embodiment of the present invention.

Referring to FIG. 6, a fourth embodiment of a microphone chip 60a of the present MEMS microphone is shown. The microphone chip 60a of the fourth embodiment is further improved over the microphone chip 30 of the first embodiment. In the fourth embodiment, there are a plurality of protrusions 61 arranged on a top section of the back plate 31 and in the air interstice 35. The protrusions 61 are made of the same material as the back plate 31. The protrusions 61 can decrease contact area between the diaphragm 33 and the back plate 31 when the diaphragm 33 is driven to deform downwardly and contact with the back plate 31 due a too-high bias voltage or other reasons. Thus, the diaphragm 33 can move upwardly easily under a resilient force generated by the deformation after the bias voltage is removed. This prevents the diaphragm 33 from being adhered to the back plate 31 for a too long period.

Figure 7:
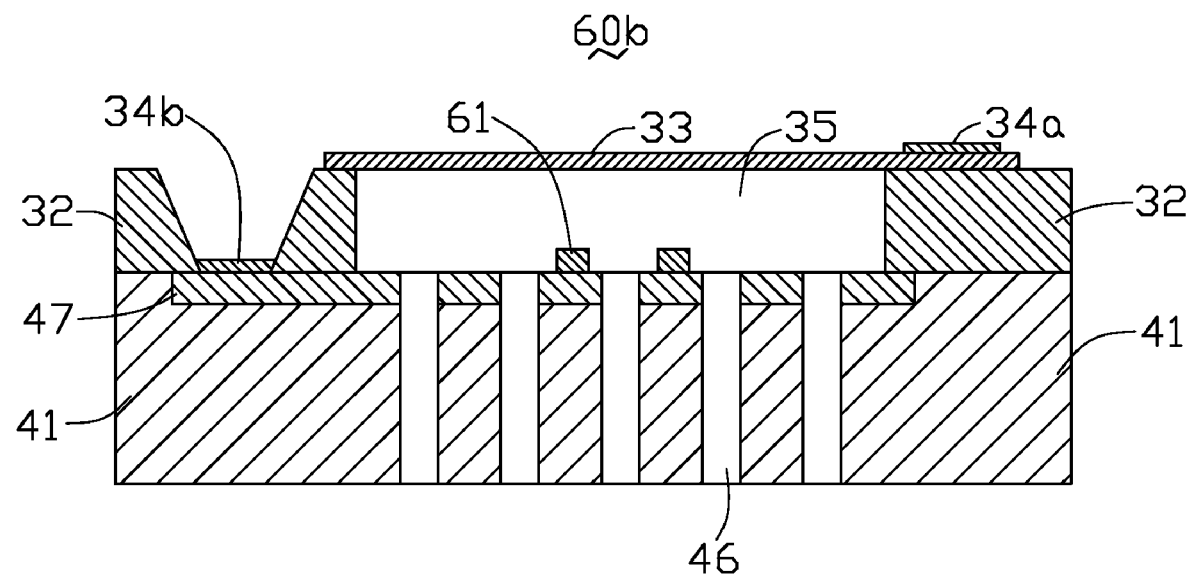
FIG. 7 is an explanation, cross sectional view of a microphone chip of an MEMS microphone in accordance with a fifth embodiment of the present invention.
Figure 8:
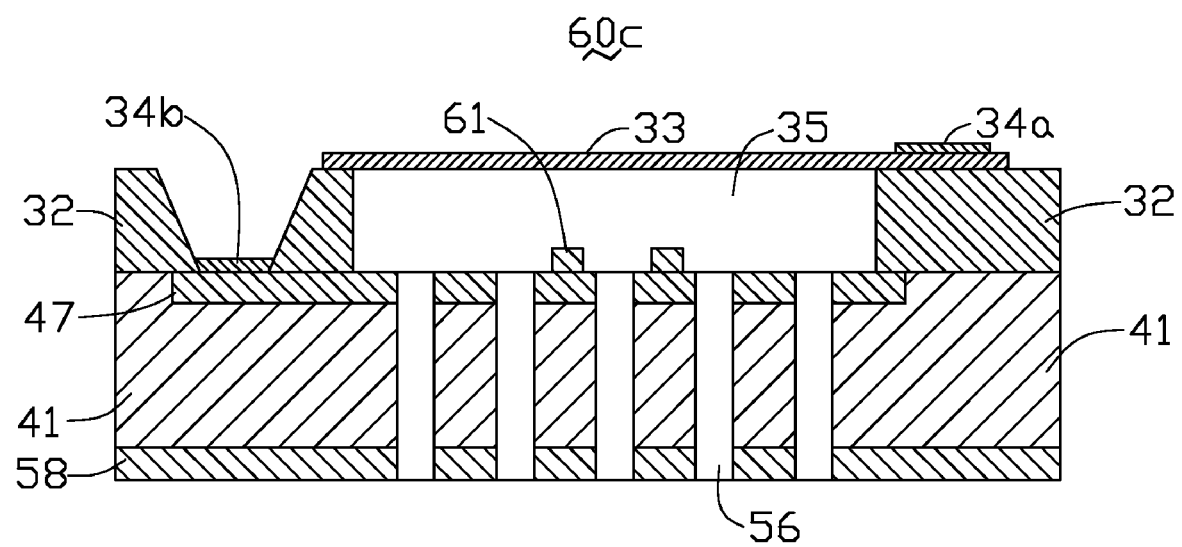
FIG. 8 is an explanation, cross sectional view of a microphone chip of an MEMS microphone in accordance with a sixth embodiment of the present invention.

Referring to FIGS. 7 and 8, fifth and sixth embodiments of microphone chips 60b, 60c of the present MEMS microphone are shown. The microphone chip 60b of the fifth embodiment is a further improvement over the microphone chip 40 of the second embodiment, whilst the microphone chip 60c of the sixth embodiment is further improved over the microphone chip 50 of the third embodiment. In the fifth and sixth embodiments, the protrusions 61 are arranged in the air interstices 35 and contact with the assistant conductive layer 47. The protrusions 61 are made of the same material as the assistant conductive layers 47.

Figure 9:
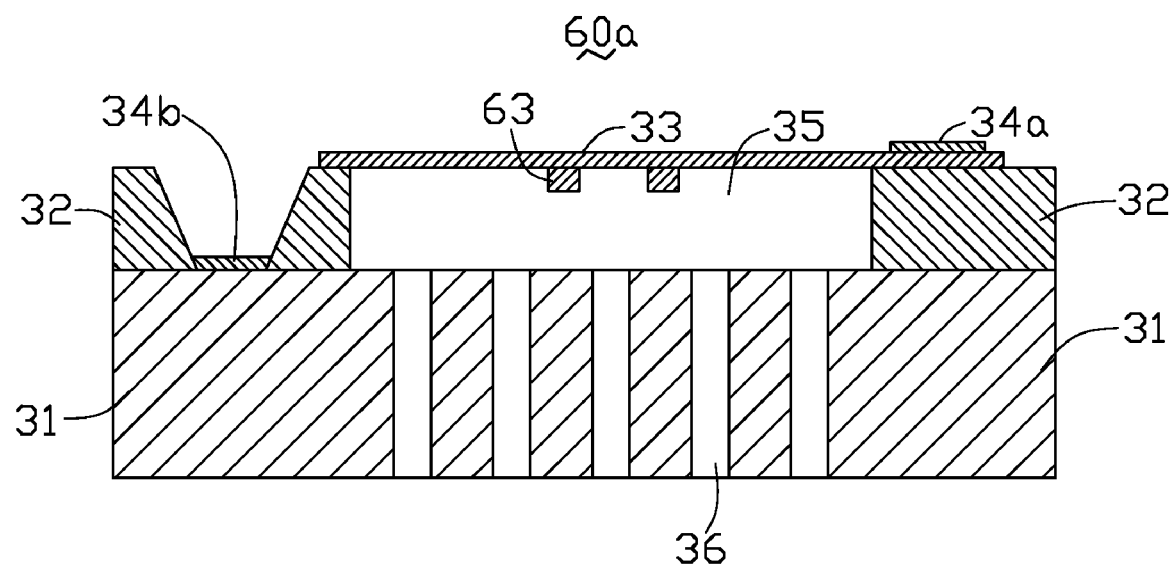
FIG. 9 is an explanation, cross sectional view of a microphone chip of an MEMS microphone in accordance with a seventh embodiment of the present invention.
Figure 10:
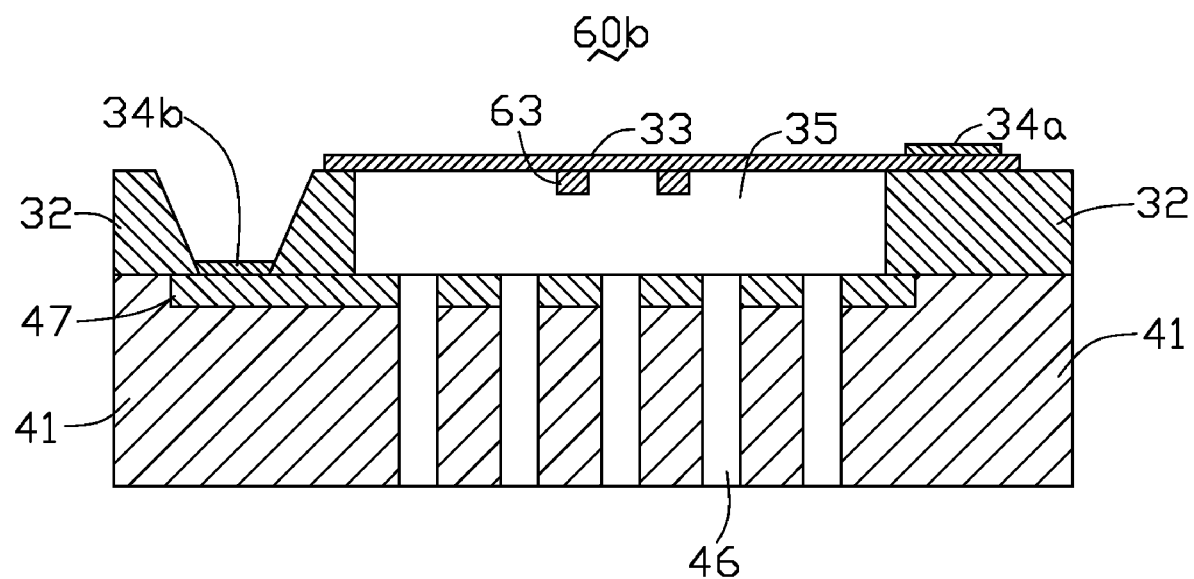
FIG. 10 is an explanation, cross sectional view of a microphone chip of an MEMS microphone in accordance with an eighth embodiment of the present invention.
Figure 11:
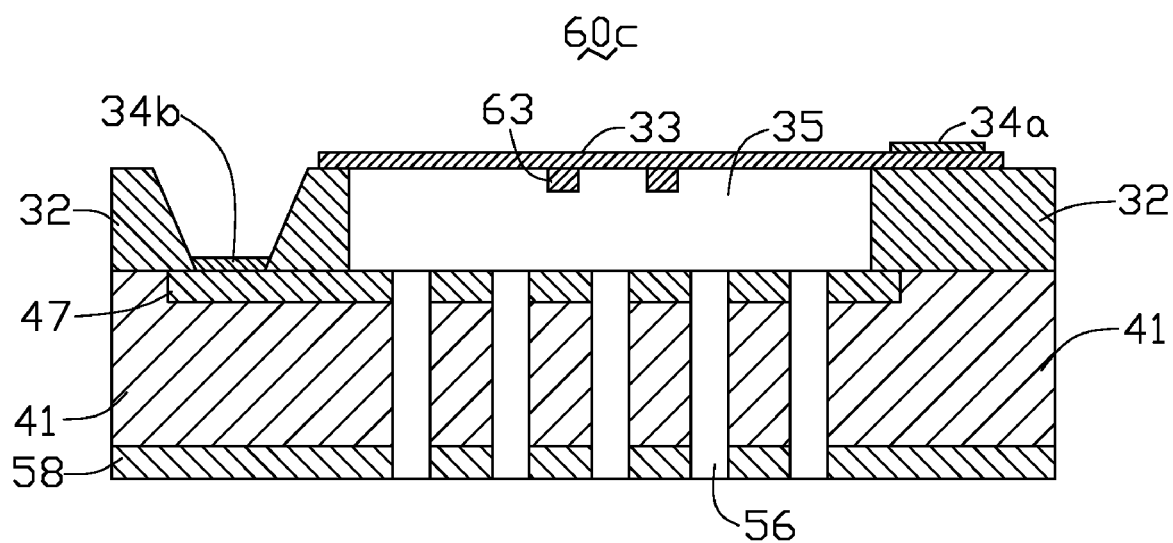
FIG. 11 is an explanation, cross sectional view of a microphone chip of an MEMS microphone in accordance with a ninth embodiment of the present invention.

Referring to FIGS. 9 to 11, the protrusions 63 are arranged in such a way that they are attached to the diaphragm 33 and have the same materials as the diaphragm 33. That is, the protrusions 63 in each embodiment of the microphone chip are made of the same materials as the elements they are attached to. Alternatively, there can be two arrays of the protrusions, which are respectively arranged on the diaphragm and the back plate, or on the diaphragm and the assistant conductive layer of the back plate.

Referring to FIGS. 12 to 15, a method for manufacturing the MEMS microphone of the first embodiment is shown. Details will be given below by referring to the drawings.

Figure 12:
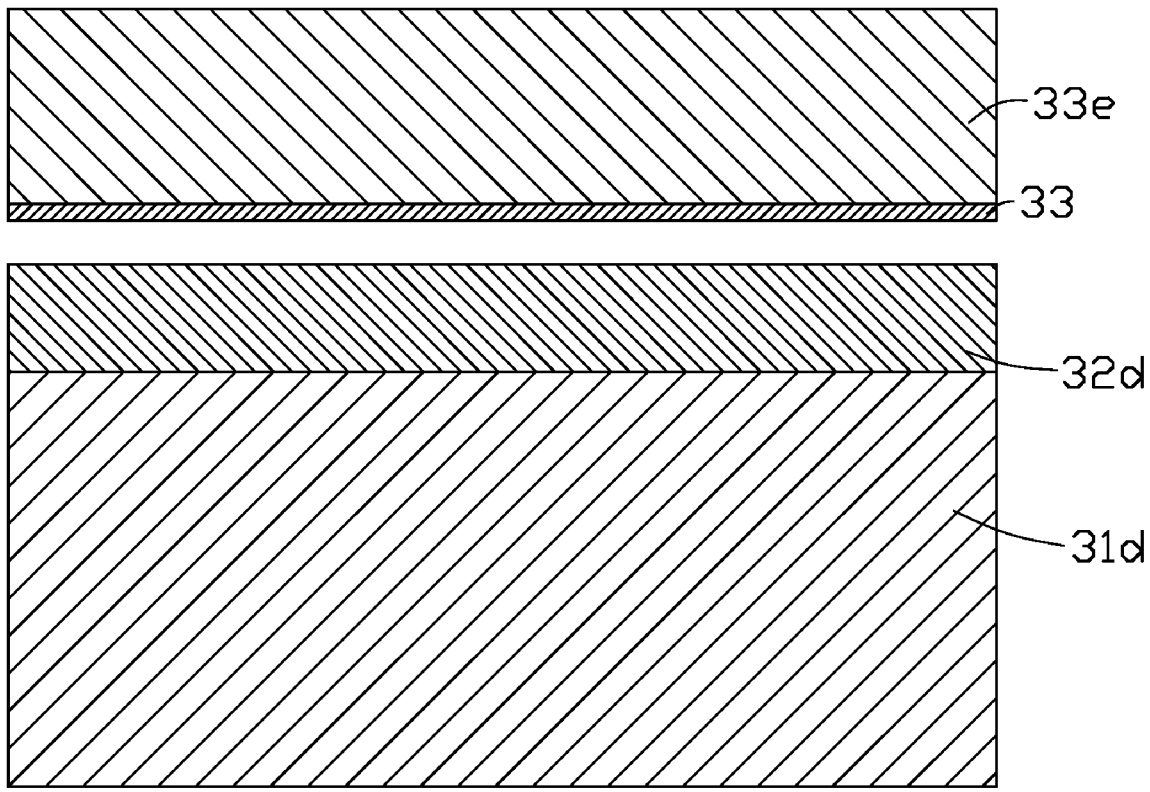
FIGS. 12 to 15 show stages in a method for manufacturing the present MEMS microphone.

As is shown in FIG. 12, two silicon substrates 31d, 33e are provided, the silicon substrate 33e being made of doped N-type silicon. The silicon substrate 31d is made of doped P-type silicon. A silicon oxide layer 32d is deposited on a top surface of the silicon substrate 31d. A doped N-type silicon layer is deposited on a bottom surface of the silicon substrate 33e so as to form the diaphragm 33 of the microphone chip 30.

Figure 13:
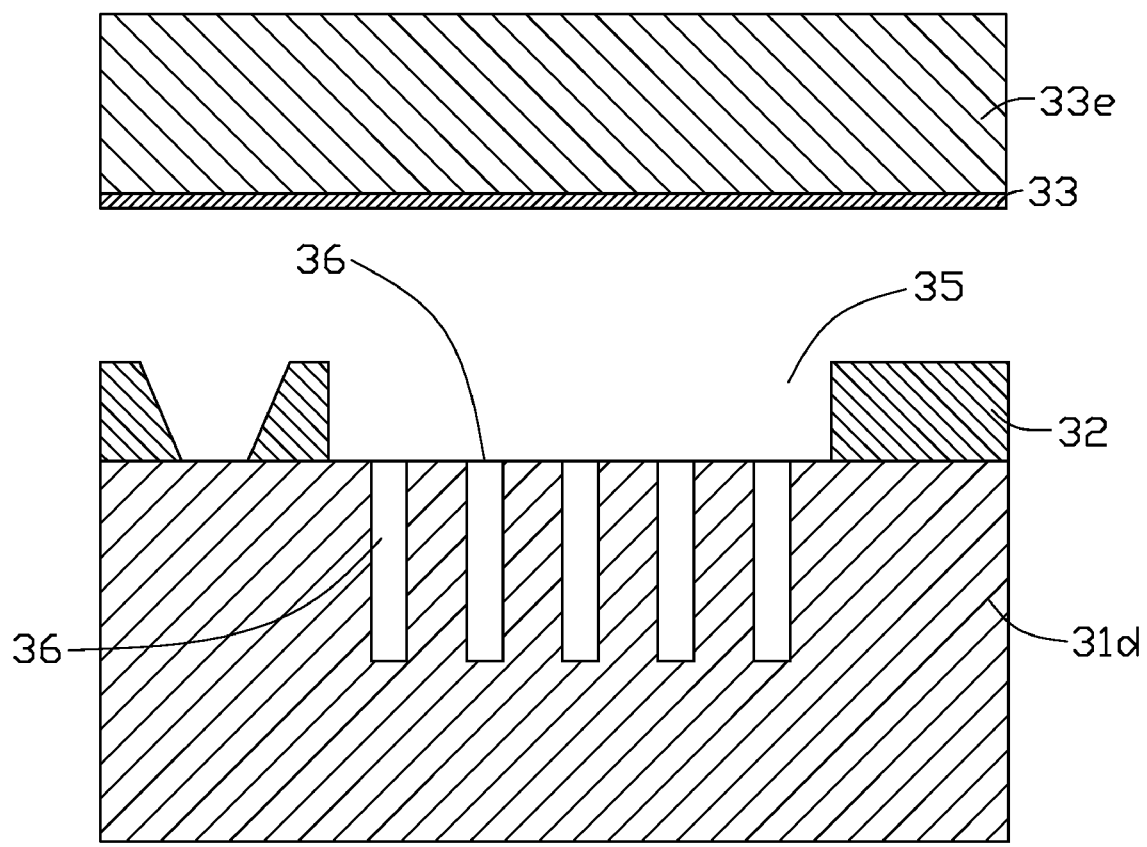

As is shown in FIG. 13, a middle portion and left portion of the silicon oxide layer 32d are etched using wet etching or dry etching method. The isolation layer 32 is formed on the remaining portion of the silicon oxide layer 32d, and the air interstice 35 is formed on the etched middle portion of the silicon oxide layer 32d. The holes 36 of the microphone chip 30 in the silicon substrate 31d are selectively etched using ICP (inductive coupled plasma), or RIE (reactive ion etching). The holes 36 do not extend through the silicon substrate 31d.

Figure 14:
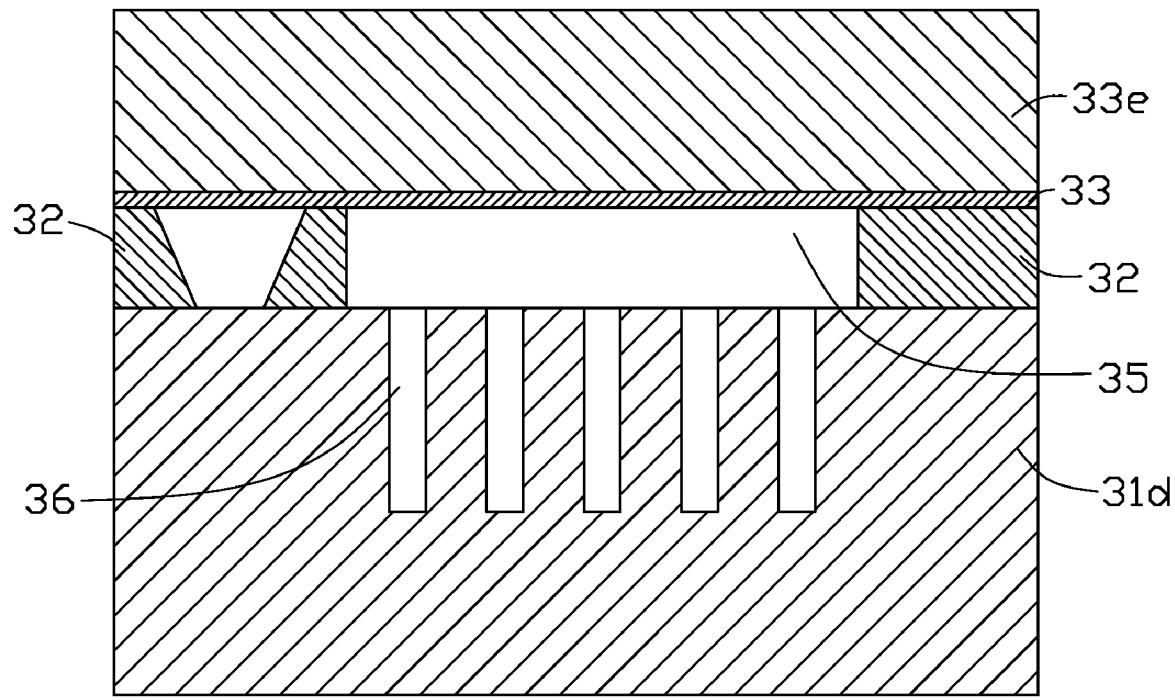

As shown in FIG. 14, the isolation layer 32 of the silicon substrate 31d is bonded to the diaphragm 33 of the silicon substrate 33e via thermal bonding or anodic bonding (electrostatic bonding) method.

Figure 15:
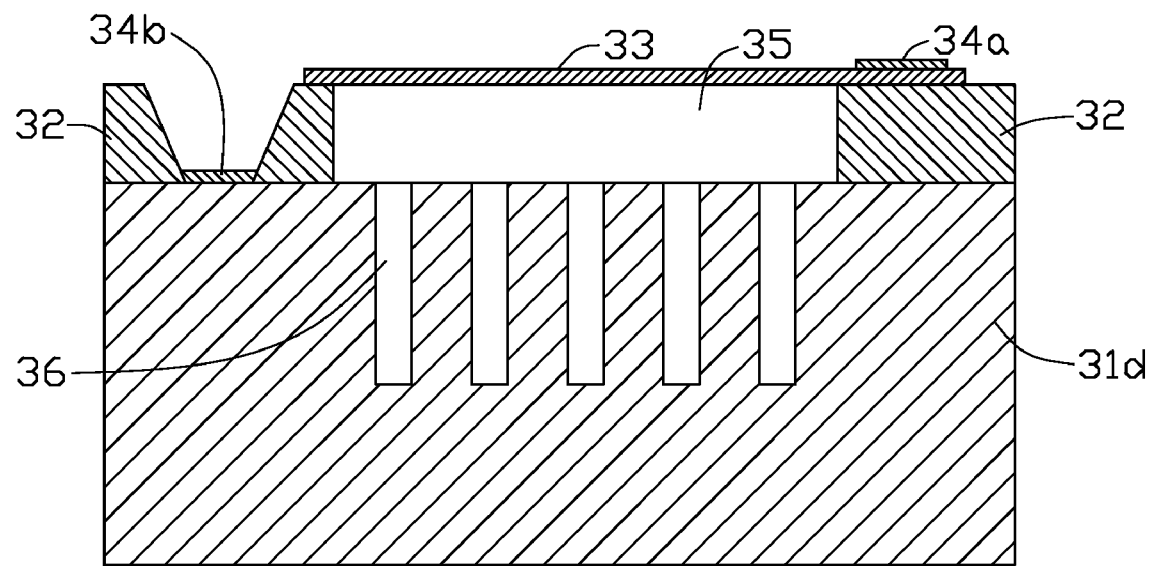

As is shown in FIG. 15, the silicon substrate 33e is removed from the diaphragm 33 via a thinning method such as electrochemical etching, shaving, or CMP (chemical mechanical polishing). A left portion of remained diaphragm 33 is etched using a dry etching method. The first and second electrodes 34a, 34b are respectively deposited on the diaphragm 33 and the silicon substrate 31d using an evaporation or a sputtering method. A bottom section of the silicon substrate 31d is thinned until the holes 36 are revealed. The thinned silicon substrate 31d forms the back plate 31 of the microphone chip 30. The microphone chip 30 of the first embodiment is then inserted into the casing 10, thus obtaining the MEMS microphone.

Referring to FIGS. 16 to 20, a method for manufacturing the microphone chips 40, 50 of the second and third embodiments is shown.

Figure 16:
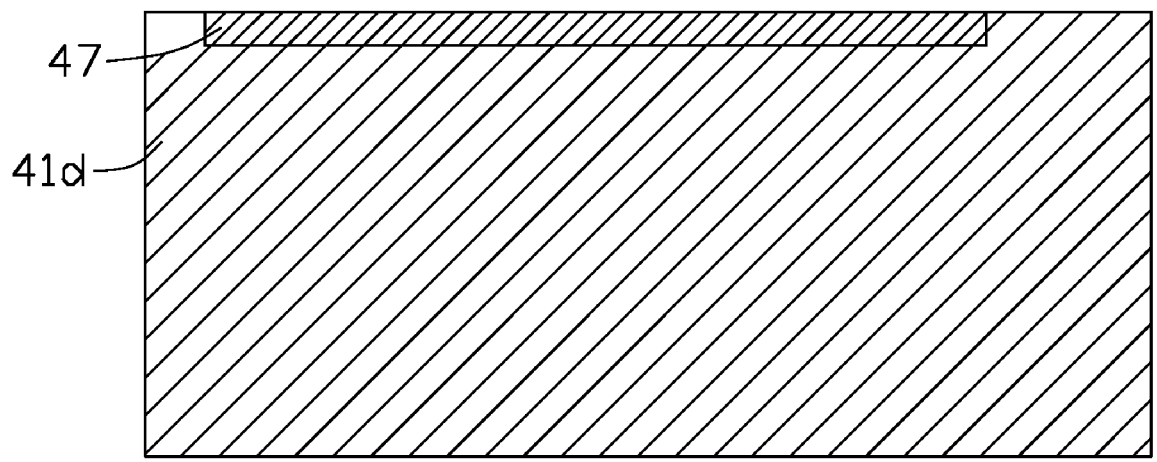
FIGS. 16 to 20 show stages of another method for manufacturing the present MEMS microphone.

Referring to FIG. 16, a silicon substrate 41d is provided. A layer of highly doped assistant conductive layer 47 is formed in a middle portion of a top section of the silicone substrate 41d via heavy boron diffusion or plasma immersion method. The silicon substrate 41d is made of doped P-type silicon.

Figure 17:
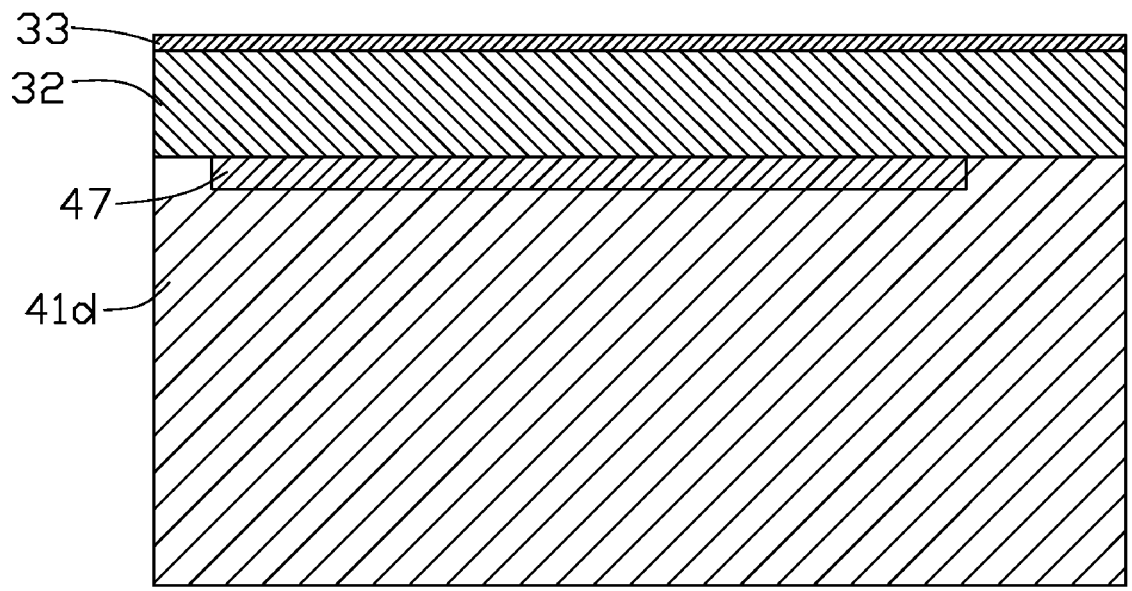

Referring to FIG. 17, an isolation layer 32 is deposited on the assistant conductive layer 47 and a periphery portion of the top section of the silicon substrate 41d. A diaphragm 33 is deposited on the isolation layer 32.

Figure 18:
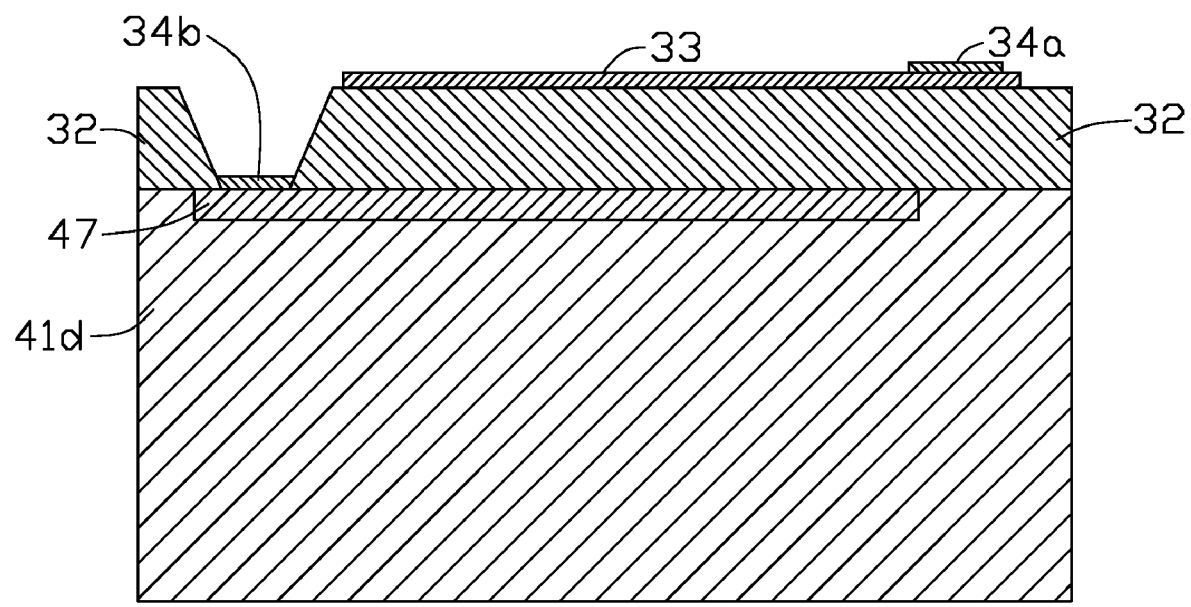

Referring to FIG. 18, a left portion of the diaphragm 33 is etched, and a left potion of the isolation layer 32 is selectively etched through. The second electrode 34b is deposited on the silicon substrate 41d at a portion over the left portion of the assistant conductive layer 47, and the first electrode 34a is deposited on a right portion of the diaphragm 33.

Figure 19:
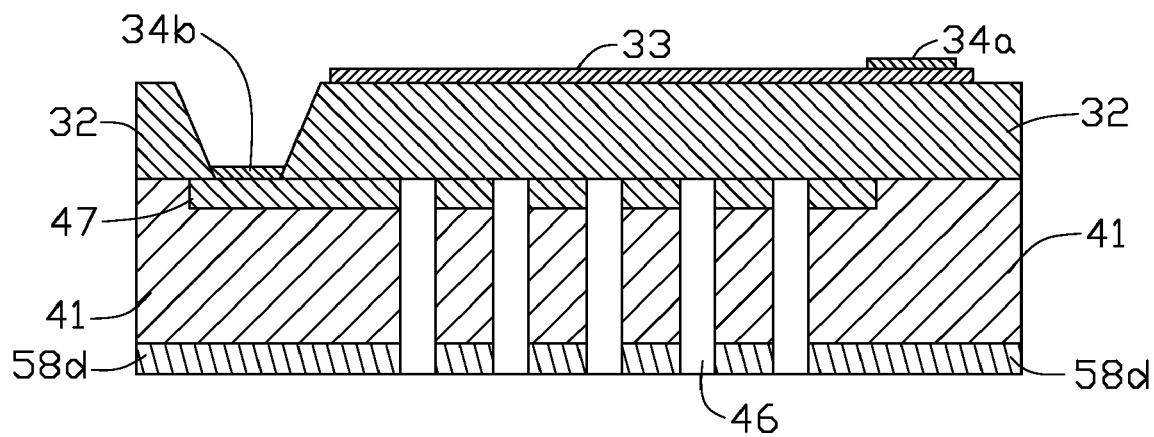

Referring to FIG. 19, a bottom section of the silicon substrate 41d is thinned so as to form the back plate 41. A mask layer 58d is etched on the bottom section of the back plate 41. The holes 46 are etched in the mask layer 58d via deep silicon etching method such as DRIE (deep reactive ion etching) method.

Figure 20:
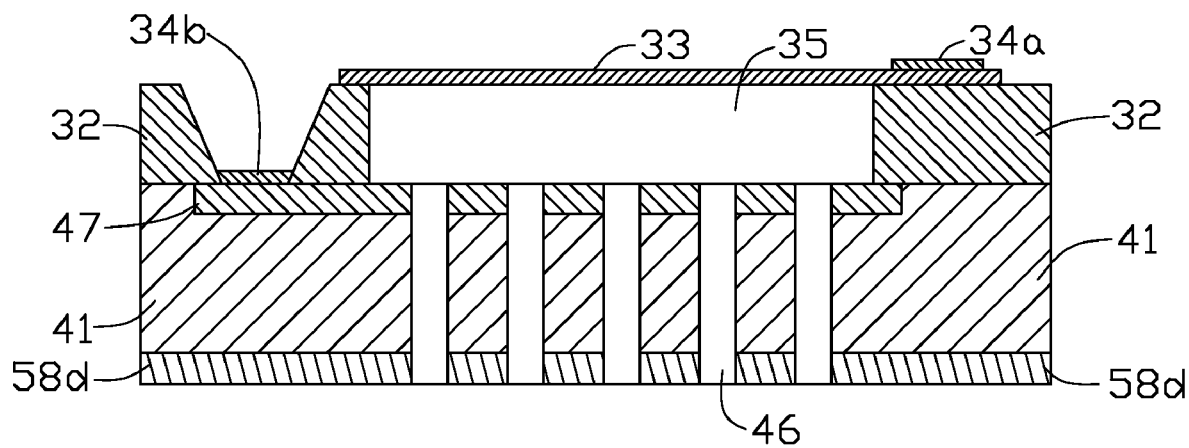

Referring to FIG. 20, the isolation layer 32 is etched through the holes 46 so as to form the air interstice 35 via dry etching method such as ICP (inductive coupled plasma) method or RIE (reactive ion etching) method, or wet etching method, or release-etching method. The mask layer 58d is removed from the back plate 41 so as to form the microphone chip 40 of the second embodiment.

Furthermore, a passivation layer 58 is deposited on the back plate 41 after the mask layer 58d is removed. The microphone chip 50 of the third embodiment is obtained. Alternatively, the mask layer 58d can function as the passivation layer 58 of the third embodiment. In this case, there is no need to get rid of the mask layer 58d from the back plate 41.

In the present methods, the microphone chip 30 of the first embodiment can be made by the method shown in FIGS. 16 to 20. Under this status, there is no need to form the assistant conductive layer 47 on the silicon substrate 41d of FIG. 16. Similarly, the microphone chip 30 of the second embodiment can be made by the method shown in FIGS. 12 to 15. Under this status, an assistant conductive layer 47 is diffused or immersed in a middle portion of a top section of the silicon substrate 31d of FIG. 12 before depositing the silicon oxide layer 32d. Furthermore, the microphone chip 50 of the third embodiment can also be made by the method shown in FIGS. 12 to 15. Under this status, a passivation layer 58 is deposited on thinned silicon substrate 31d and a plurality of holes corresponding to the holes 46 are etched in the passivation layer 58 after of the microphone chip 40 of the second embodiment is obtained.

In the present methods, if we deposit a plurality of protrusions 61, 63 on the diaphragm 33 or the silicon substrate 31d of FIG. 13, the microphone chip 60a of the fourth or seventh embodiment is obtained. If we form a plurality of protrusions 61, 63 on the diaphragm 33 or the assistant conductive layer 47 of the silicon substrate 41d of FIG. 20, the microphone chip 60b, 60c of the fifth, or the sixth, or eighth, or the ninth embodiment is obtained.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A MEMS microphone comprising:
a casing defining a sound entrance therein; and
a microphone chip disposed in the casing and comprising a back plate, an isolation layer and a diaphragm, the isolation layer separating the back plate from the diaphragm and forming an air interstice therebetween, the diaphragm and the back plate respectively electrically connected with a first electrode and a second electrode, the back plate defining a plurality of holes therethrough, the holes communicating with the air interstice, one of the diaphragm and the back plate facing the sound entrance and the microphone chip is over the sound entrance of the casing and hermetically connected with the casing so as to form a sealed acoustic chamber between the casing and the microphone chip.

2. The MEMS microphone as described in claim 1, wherein the back plate comprises an assistant conductive layer at a side adjacent to the isolation layer.

3. The MEMS microphone as described in claim 2, wherein the assistant conductive layer is either a highly doped silicon layer heavily diffused by boron or a thin metal layer.

4. The MEMS microphone as described in claim 2, wherein a plurality of protrusions are arranged on the assistant conductive layer at a side adjacent to the diaphragm.

5. The MEMS microphone as described in claim 1, wherein a plurality of protrusions are arranged on the back plate at a side adjacent to the diaphragm.

6. The MEMS microphone as described in claim 1, wherein a passivation layer is formed on the back plate at a side far away from the diaphragm.

7. The MEMS microphone as described in claim 1, wherein a plurality of protrusions are arranged on the diaphragm at a side adjacent to the back plate.

8. The MEMS microphone as described in claim 1, further comprising electrical circuits received in the casing and electrically connecting with the microphone chip.

9. The MEMS microphone as describe in claim 1, wherein a side face of the back plate opposite from the isolation layer is flat in configuration.

* * * * *